(12) United States Patent
Beccue

(10) Patent No.: US 7,545,225 B2
(45) Date of Patent: Jun. 9, 2009

(54) REGENERATION DEVICE FOR ROTARY TRAVELING WAVE OSCILLATOR

(75) Inventor: Stephen Mark Beccue, Oxnard, CA (US)

(73) Assignee: Multigig Inc., Scotts Valley, CA (US)

( * ) Notice: Subject to any disclaimer, the term of this patent is extended or adjusted under 35 U.S.C. 154(b) by 65 days.

(21) Appl. No.: 11/463,844

(22) Filed: Aug. 10, 2006

(65) Prior Publication Data
US 2007/0257736 A1 Nov. 8, 2007

Related U.S. Application Data

(63) Continuation-in-part of application No. 10/275,461, filed as application No. PCT/GB01/02069 on May 11, 2001, now Pat. No. 7,236,060.

(60) Provisional application No. 60/707,631, filed on Aug. 11, 2005.

(30) Foreign Application Priority Data

| May 11, 2000 | (GB) | ................................... 0011243.3 |
| Oct. 6, 2000 | (GB) | ................................... 0024522.2 |
| Feb. 3, 2001 | (GB) | ................................... 0102700.2 |

(51) Int. Cl.
*H03B 5/18* (2006.01)
(52) U.S. Cl. ..................... 331/57; 331/96; 331/107 SL; 331/45; 331/55
(58) Field of Classification Search .................... 331/45, 331/57, 55, 96, 107 SL
See application file for complete search history.

(56) References Cited

U.S. PATENT DOCUMENTS 5,677,599 A 10/1997 Wood
5,945,847 A 8/1999 Ransijn (Continued)

FOREIGN PATENT DOCUMENTS

GB 2 349 524 A 11/2000

(Continued)

OTHER PUBLICATIONS

K. Bhattacharyya et al., 2004, "1.2V 1-10 GHz Traveling Wave Amplifiers Using Coplanar Waveguides as On-Chip Inductors," *IEEE RAWCON Conference.*

(Continued)

*Primary Examiner*—Arnold Kinkead
(74) *Attorney, Agent, or Firm*—IPxLaw Group LLP

(57) ABSTRACT

An oscillator is described. The oscillator includes segments of two-conductor transmission line being connected together by an odd number of connection means to form a closed loop. A plurality of current switches is connected to the conductors of the segments and a high impedance element, such as an inductor or transmission line, is connected to a conductor of at least one segment. The high impedance element sources current into the closed loop and the current switches sink current from one or the other of the conductors of the loop depending on the state of the switch. The switches cause a wave to be established and maintained on the loop and the wave changes the state of the switches as it oscillates. One embodiment of the switches employs npn transistors whose emitters are connected to a current source and another uses NMOS transistors.

14 Claims, 7 Drawing Sheets

U.S. PATENT DOCUMENTS

| | | | |
|---|---|---|---|
| 6,239,663 | B1 | 5/2001 | Mizutani |
| 6,525,618 | B2 | 2/2003 | Wood |
| 6,556,089 | B2 | 4/2003 | Wood |
| 6,853,260 | B1 * | 2/2005 | Hajimiri et al. ............... 331/96 |
| 7,161,438 | B2 * | 1/2007 | Wood ........................... 331/57 |
| 7,218,180 | B2 * | 5/2007 | Wood ........................... 331/96 |
| 7,236,060 | B2 * | 6/2007 | Wood ........................... 331/57 |
| 2002/0190805 | A1 | 12/2002 | Wood |
| 2003/0006851 | A1 | 1/2003 | Wood |
| 2005/0093637 | A1 | 5/2005 | Hajimiri et al. |
| 2005/0156680 | A1 | 7/2005 | Wood |

FOREIGN PATENT DOCUMENTS

| | | |
|---|---|---|
| WO | 00/44093 | 7/2000 |
| WO | 2004/073293 A2 | 8/2004 |
| WO | 2004/102787 A2 | 11/2004 |
| WO | WO 2005/050776 A2 | 6/2005 |

OTHER PUBLICATIONS

Divina et al., 1998, "The Distributed Oscillator at 4 GHZ," *IEEE*, 1-4.

Guckenberger et al., 2004, "Differential Distributed Amplifier and Oscillator in SiGe BiCMOS using Close-Packed Interleaved On-Chip Transmission Lines," *IEEE*, 68-71.

Kim et al., 2000, "WP 26.3 A Low-Phase-Noise CMOS LC Oscillator with a Ring Structure," *IEEE*.

Kleveland et al., 1999, "MP 4.3 Monolithic CMOS Distributed Amplifier and Oscillator," *IEEE*.

Lee et al., 2003, "13.7 A 40Gb/s Clock and Data Recovery Circuit in 0.18 μm CMOS Technology," *IEEE*.

Le Grande de Mercey, 2004, "18GHZ-36GHZ Rotary Traveling Wave Voltage Controlled Oscillator In A CMOS Technology," *Universität der Bundeswehr München*.

"Rotary Explorer v0.5 User's Guide," *MultiGiG Ltd.*, 1-33. 2000/2001.

Skvor et al., 1992, Novel Decade Electronically Tunable Microwave Oscillator Based on the Distrubuted Amplifier, *Electronics Letters*, 28(17):1647-1648.

Wood et al., 2001, "25.5 Multi-Gigahertz low-Power, Low-Skew, Rotary Clock Scheme," *IEEE*.

Written Opinion Of The International Searching Authority for PCT. US06/31458, Jul. 12, 2007.

* cited by examiner

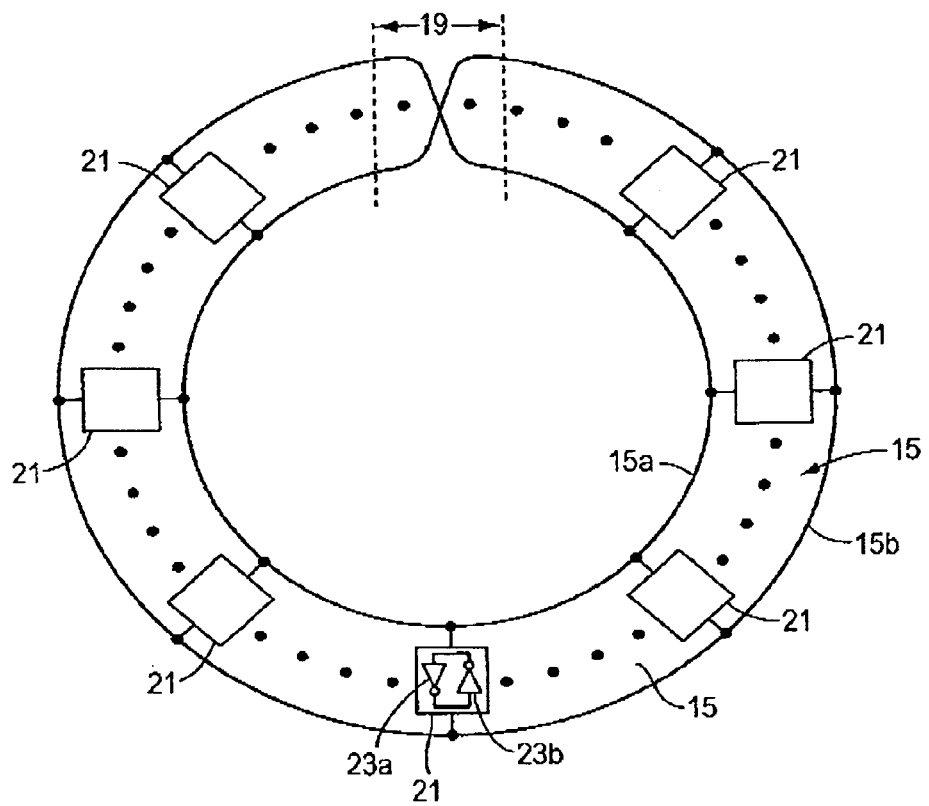
FIG. 1A
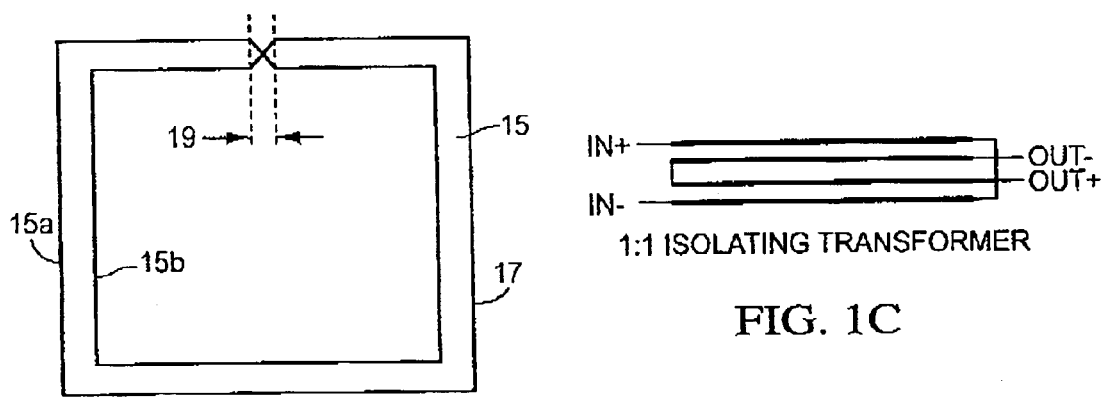
FIG. 1B
1:1 ISOLATING TRANSFORMER
FIG. 1C

REGENERATION DEVICE FOR ROTARY TRAVELING WAVE OSCILLATOR

CROSS-REFERENCE TO RELATED APPLICATIONS

This application claims priority to U.S. Provisional Patent Application Ser. No. 60/707,631, filed Aug. 11, 2005, titled "REGENERATION DEVICE FOR ROTARY TRAVELING WAVE OSCILLATOR," and is a continuation-in-part of U.S. application, Ser. No. 10/275,461, now U.S. Pat. No. 7,236,060, filed Apr. 7, 2003 now U.S. Pat. No. 7,236,060, and titled "ELECTRONIC PULSE GENERATOR AND OSCILLATOR," which application is incorporated by reference into the present application.

This application claims the benefit of application Ser. No. 10/275,461, which is a national stage application of PCT application, PCT/GB01/02069, publication number WO 01/89088, filed May 11, 2001, and this application and the PCT/GB01/02069 application claim priority to GB0011243.3, filed May 11, 2000, GB0024522.2, filed Oct. 6, 2000, and GB0102700.2, filed Feb. 3, 2001. The PCT/GB01/02069, GB0011243.3, GB0024522.2, and GB0102700.2 are incorporated by reference into the present application. U.S. Pat. No. 6,556,089 is incorporated by reference into the present application.

FIELD OF THE INVENTION

This invention relates generally to an energy source for a traveling wave and more particularly to a regeneration device for initiating and maintaining a traveling wave on a rotary traveling wave oscillator.

DESCRIPTION OF THE RELATED ART

FIG. 1A shows a transmission-line 15 as a structure that is physically as well as electromagnetically endless, specifically comprising a single continuous "originating" conductor formation 17 shown forming two appropriately spaced generally parallel traces as loops 15a, 15b with a crossover at 19 that does not involve any local electrical connection of the conductor 17. The length of the originating conductor 17, taken as S, corresponds to two 'laps' of the transmission-line 15 as defined between the spaced loop traces 15a, 15b and through the cross-over 19. The crossover 19 produces a Moebius strip effect where edge traces of the loops 15a, 15b invert from lap to lap. Alternatively, the structure 15 can be viewed as one or more transmission line segments, where each segment has between its ends a length of spaced apart first and second conductors 15a, 15b. Each conductor is electrically continuous, meaning that there are no breaks in the conductors and no active elements in series with the conductors. A passive connection means 19 connects the ends of each segment (the same segment, if there is only one segment) to form a closed loop. Only an odd number of connection means 19 is permitted. Each connection means 19 causes a reversal in the voltage polarity, without the use of active devices, between the first and second conductors. In one embodiment, the connection means is a crossover connection 19, as shown in FIG. 1B. In another embodiment, the connection means is a transformer, such as an inverting transmission line transformer, as shown in FIG. 1C. See also FIG. 16C of the U.S. application Ser. No. 10/275,461 and FIG. 11 of the U.S. Pat. No. 6,556,089.

As a pulse generator or an oscillator, the transmission-line 15 has associated plural spaced active means 21 conveniently of bi-directional switching/amplifying nature shown as two inverters 23a, 23b connected back-to-back between the conductors 15a, 15b, in FIG. 1A. Alternative active regenerative means 21 could rely on negative resistance, negative capacitance or be otherwise suitably non-linear and regenerative (such as Gunn diodes). FIG. 1A shows the respective input and output terminals of each circuit 21 connected to the transmission line 15 between the conductors 15a, 15b at substantially maximum spacing apart along the effectively single conductor 17; thus, each is located substantially halfway around the transmission-line 15 relative to the other.

FIG. 1B shows a convenient simplified/idealized representation that omits the active means 21. These can be any odd number of crossovers 19, and the transmission line loop 15 can be any shape, including geometrically irregular, as long as it has a length appropriate to the desired operating frequency. A signal leaving an amplifier 21 arrives back inverted after a full 'lap' of the transmission-line 15, which is traversed in a propagation time Tp. This effectively defines a pulse width or half-cycle oscillation time of a full-cycle bipolar operating frequency.

Initially, random amplification of inherent noise within the amplifiers 21 quickly settles to an effective oscillation at a fundamental frequency F, where $F=1/(2Tp)$, and this occurs typically within nanoseconds.

A small number of spaced-apart inverter pairs 23a and 23b connected between the bandwidth-limited conductors 15a, 15b, leads to a substantially sinusoidal waveform at the fundamental frequency. A sufficient number of spaced-apart inverter pairs 23a and 23b connected between the bandwidth-limited conductors 15a, 15b and the fast switching times of the inverters 23a, 23b lead to a strongly square waveform, which contains odd harmonics of the fundamental frequency F effectively reinforced. At the fundamental oscillating frequency F, the terminals of the amplifiers 21 appear substantially unloaded, due to the transmission-line 15 being 'closed-loop' without any form of termination, which results very desirably in low power dissipation and low drive requirements. It can also be desirable and advantageous to alter, independently, the impedance and resistance of the conductors and the conductance and capacitance between the conductors of the transmission line 15. Such alterations change the propagation constant, $\gamma$, of the line, without changing its physical length. Changing the propagation constant without changing the physical length of the line is sometimes called changing the electrical length of the line.

The evident continuous DC path directly connecting all inputs and outputs of the inverters has no stable DC operating point, and this DC instability is compounded by the regenerative (+Ve feedback) action of the back-to-back inverters. For any inverter and its output signal path with reference to the ground plane, its output arrives back at its input after one lap of the transmission line 15, in both the clockwise or anticlockwise direction, both waves being launched and arriving back together. Self-sustaining, reinforcing action occurs when the input arrives with a phase that differs with the output phase by 180 degrees and the additional 180-degree phase shift of the inverter contributes to such reinforcing.

Coherent pulse or oscillation operation occurs when the signal in the transmission line meets this requirement for all connected inverters. In such a case, all inverters are working in a coordinated manner resulting in known phase relationships between all points on the transmission line. A single rotating traveling wave, rotating either clockwise or anti-clockwise, on the line, meets this criterion. FIGS. 2A and 2B show (i) the line current flow by arrow-heads, (ii) the polarity by circled plus and minus signs, (iii) the direction of rotation by full arrows, and (iv) the phase from an arbitrary 0/360 degree position, for a two-lap traverse of the path 15. During rotation, the wavefront incident upon an inverter overrides its previous drive direction due to the low impedance of the wave compared to the input impedance of a single transistor. Once overridden, the inverters contribute to imposing the new wave polarity by connecting the transmission line terminal to the correct power source polarity. This maintains 'top-up' energy to give substantially constant amplitude in the presence of (mainly resistive) losses in the transmission line. Switching by the transistors also helps prevent the build-up of any counter-direction waves, effectively acting as wave gates.

Once the structure has established a rotation in one direction, the rotation can change only by removing and reversing the electromagnetic energy in the structure. To complete a full bipolar cycle of oscillation, a wave must make two 'laps' of the structure in order to complete a 360 degree phase shift, i.e., each complete lap is only 180 degrees of phase shift. Rapid rise and fall times are a consequence of the short transit-time of the MOSFETs, typically 1 ps to 5 ps range in VLSI CMOS, and a short length of transmission line between them. The transistors do not drive a capacitive load, as load and gate are switched by the incident wave, i.e., operation is transit time limited, and the waves are square with very good symmetry between phases, where there are a sufficient number of regeneration devices so that the length between the regeneration devices is short.

FIG. 3A shows the connection of the regeneration devices between the conductors of the transmission line segment in more detail and FIG. 3B shows the internal transistor structure, in one embodiment, of the regeneration devices connected between the conductors of the transmission line segment. As is apparent from the figure, conductor A is connected to the gate inputs of transistors P1 and N1 and to the junction of the drains of transistors P2 and N2 at a first tap position 40. Conductor B is connected to the gate inputs of P2 and N2 and to the junction of drains of P1 and N1 at a second tap position 42. The sources of P1 and P2 are connected to VDD 44 and the sources of N1 and N2 are connected to ground 46, and it is these power and ground connections that provide energy to the wave to make up for the losses. In another embodiment, the internal transistor structure of an inverter has a passive load device, such as a resistor, in place of either the p- or n-channel transistors. In yet another embodiment, the inverter is constructed from bipolar transistors. In yet another embodiment, the inverter is constructed from a combination of bipolar and FET transistors.

In operation, when a differential mode wave travels on the A and B conductors (say, with a positive voltage on A with respect to B) and reaches the first tap position 40, the inverter comprising P1 and N1 begins to switch so as to make N1 conductive, reinforcing the voltage on conductor B. At about the same time, the wave reaches the second tap position 42 and the inverter comprising P2 and N2 begins to switch to make P2 conductive, reinforcing the voltage on conductor A. Thus, the switching tends to reinforce the wave traveling by the tap positions.

FIG. 4 shows the same regeneration device except with different tap positions. In particular, the output position A1 50 on conductor A for the drains of M3 and M4 is offset from the tap position B0 52 of the gates of M3 and M4 on conductor B. Similarly, the output position B1 54 on conductor B is offset from the tap position of A0 56 of the gates of M1 and M5. This configuration promotes oscillation startup in the "Easy Direction," as shown, because the drain outputs have a coherent delay in the Easy Direction. Another effect of this arrangement is that the waveforms at the taps have faster rise and fall times.

BRIEF SUMMARY OF THE INVENTION

One embodiment of the present invention is an oscillator that includes one or more transmission line segments, an odd number of connection means, a plurality of current switches and at least one conductive element. Each of the transmission line segments is a length of two conductor transmission line having a controlled impedance. The connection means are used to connect the lengths of the segments together to form a closed loop of segments and connection means. Each connection means is energy continuous and the oscillator has a frequency determined by two transits of a wave traveling about the closed loop. Each of the current switches has a pair of nodes connected to the conductors of the segments and another node connected to a first reference voltage and passes current from one or the other of the conductors of the closed loop to the first reference voltage depending on the state of the switch. The one or more conductive elements are connected between a conductor of one of the segments and a second reference voltage and provides a current path between the second reference voltage and the conductor of the signal path to conduct current to or from the loop. The conductive element has an impedance at the frequency of the oscillator that is higher than the impedance of the transmission line. The plurality of current switches induces and maintains the traveling wave, on the loop, the wave including a voltage wave with either one of two polarities, and each of the connection means is operative to reverse the polarity of the voltage wave, such that any position on a segment, there is an oscillating waveform between the conductors.

Another embodiment of the present invention is a method of maintaining a traveling wave on a rotary traveling wave oscillator that includes one or more segments, each segment being a length of two-conductor transmission line having a controlled impedance; and an odd number of connection means for connecting the lengths of the segments together to form a closed loop of segments and connection means, wherein each connection means is energy continuous and the oscillator has a frequency determined by two transits of a wave traveling about the closed loop. The method includes the steps of (i) providing a current path to a conductor of at least one of the segments via a conductive element having an impedance at the oscillator frequency that is greater than the impedance of the closed loop, and (ii) passing current to or from the conductor of each segment to reinforce a differential voltage between the conductors as the wave travels through the segment, so as to maintain the voltage of the traveling wave.

One advantage of the present invention is that the oscillator has low noise characteristics.

Another advantage is that slower type P-type devices need not be used, thereby allowing higher frequency operation.

BRIEF DESCRIPTION OF THE DRAWINGS

These and other features, aspects and advantages of the present invention will become better understood with regard to the following description, appended claims, and accompanying drawings where:

FIGS. 1A and 1B show a rotary traveling wave oscillator and FIG. 1C shows a transformer crossover connection;

DETAILED DESCRIPTION OF THE INVENTION

Figure 5A:
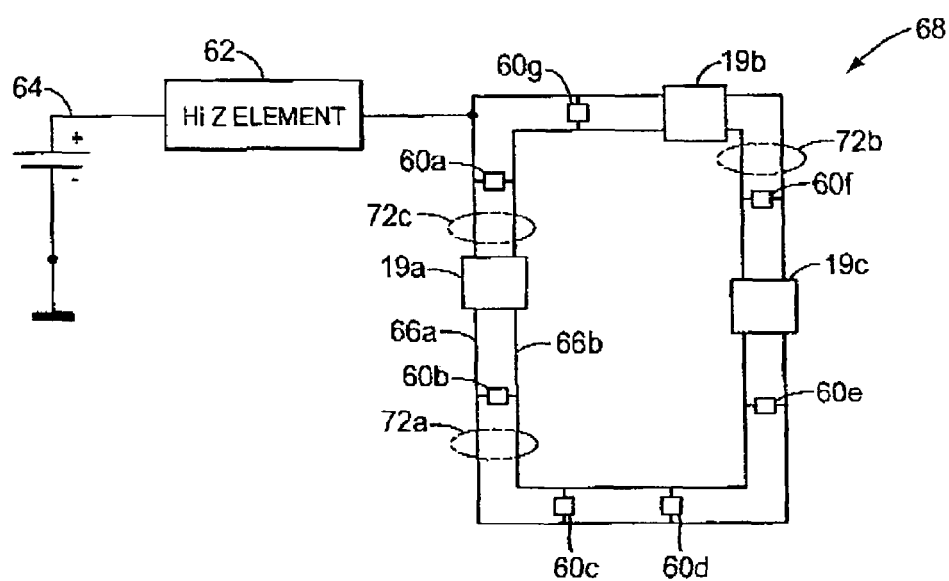
FIG. 5A shows an alternative to the regeneration devices described above.

FIG. 5A shows an alternative to the regeneration devices described above. Instead of the regeneration devices, a plurality of current switching devices 60a-g and a conductive element 62 with high-impedance are employed. The conductive element 62 is connected to a first supply voltage 64 (such as Vdd) to provide current to the oscillator at any point along the conductors 66a,b that make up the oscillator 68. Typically, the conductive element 62 has an impedance that is about twice the impedance of the transmission lines of the oscillator. Each of the current switching devices 60a-g is connected between the conductors, for example conductors 66a,b, of the two-conductor transmission line 72a,c and a second reference voltage (such as ground, shown in FIG. 6A). Thus, the conductive element 62 supplies current to the conductors 66a,b and the current switches 60a-g remove current from the conductors 66a,b, depending on the state of the conductors, where the state indicates which conductor 66a or 66b is at a relatively higher voltage than the other conductor 66b or 66a, respectively. The current switches operate to remove current from the conductor having the lower voltage.

Figure 5B:
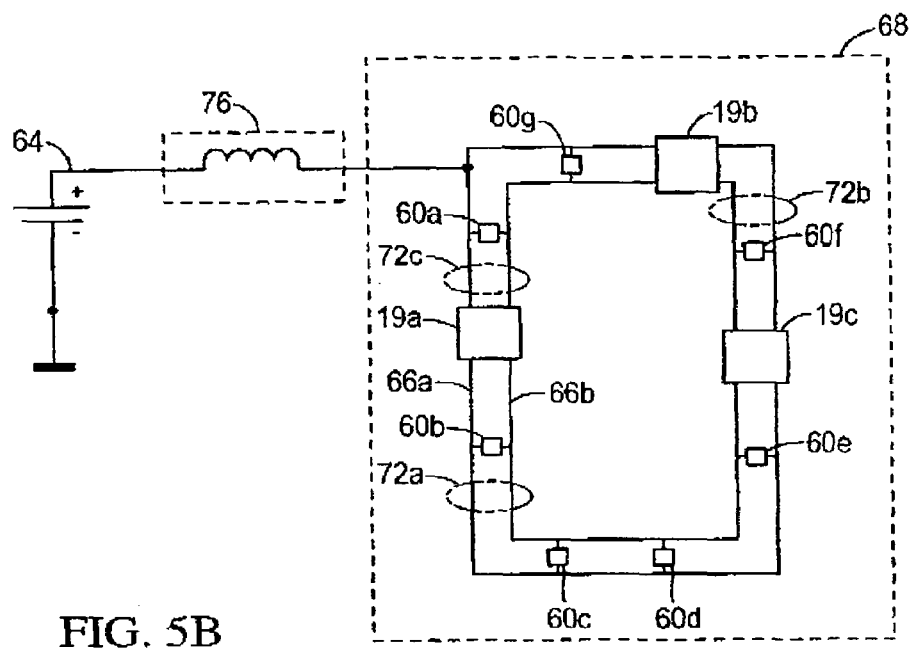
FIG. 5B shows the alternative with an inductor as the high-impedance device.

FIG. 5B shows the alternative with an inductor 76 as the conductive element. The impedance of the inductor 76 $Z_L=2\pi fL$ is chosen to be greater than the impedance of the transmission lines 66a,b making up the oscillator at the frequency f (and harmonics thereof) of operation of the oscillator 68. In some cases it may be necessary to independently supply current to different segments 72a,c of the loops because of the type of connection means 19a-c that is used. In such cases, multiple inductors connect the supply to the conductors of different segments 72a,c. The inductor can be attached anywhere in a segment.

Figure 5C:
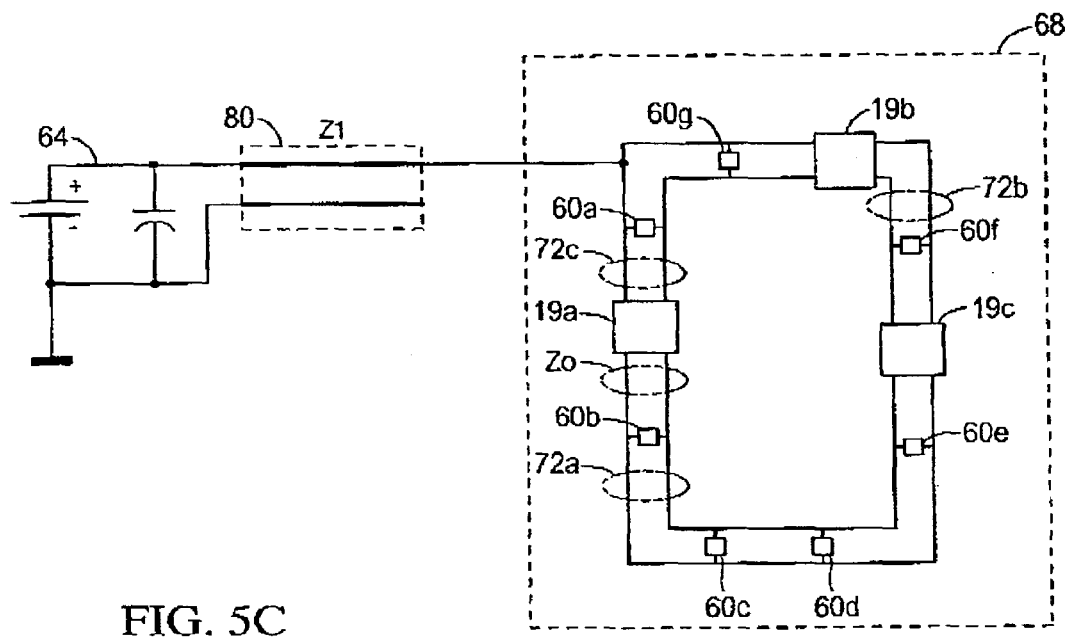
FIG. 5C shows the alternative with a transmission line as the high-impedance device.

FIG. 5C shows the alternative with a transmission line 80 as the conductive element. Again, the transmission line impedance $Z_1$, of the high-impedance device can be set to be larger than the transmission line impedance $Z_0$ of the rotary oscillator 68 at the frequency f (and harmonics thereof) of operation of the rotary oscillator. In either case, a steady (essentially dc) supply of energy is created for the loop. The transmission line 80 can be attached anywhere in a segment 72a,c.

Figure 6A:
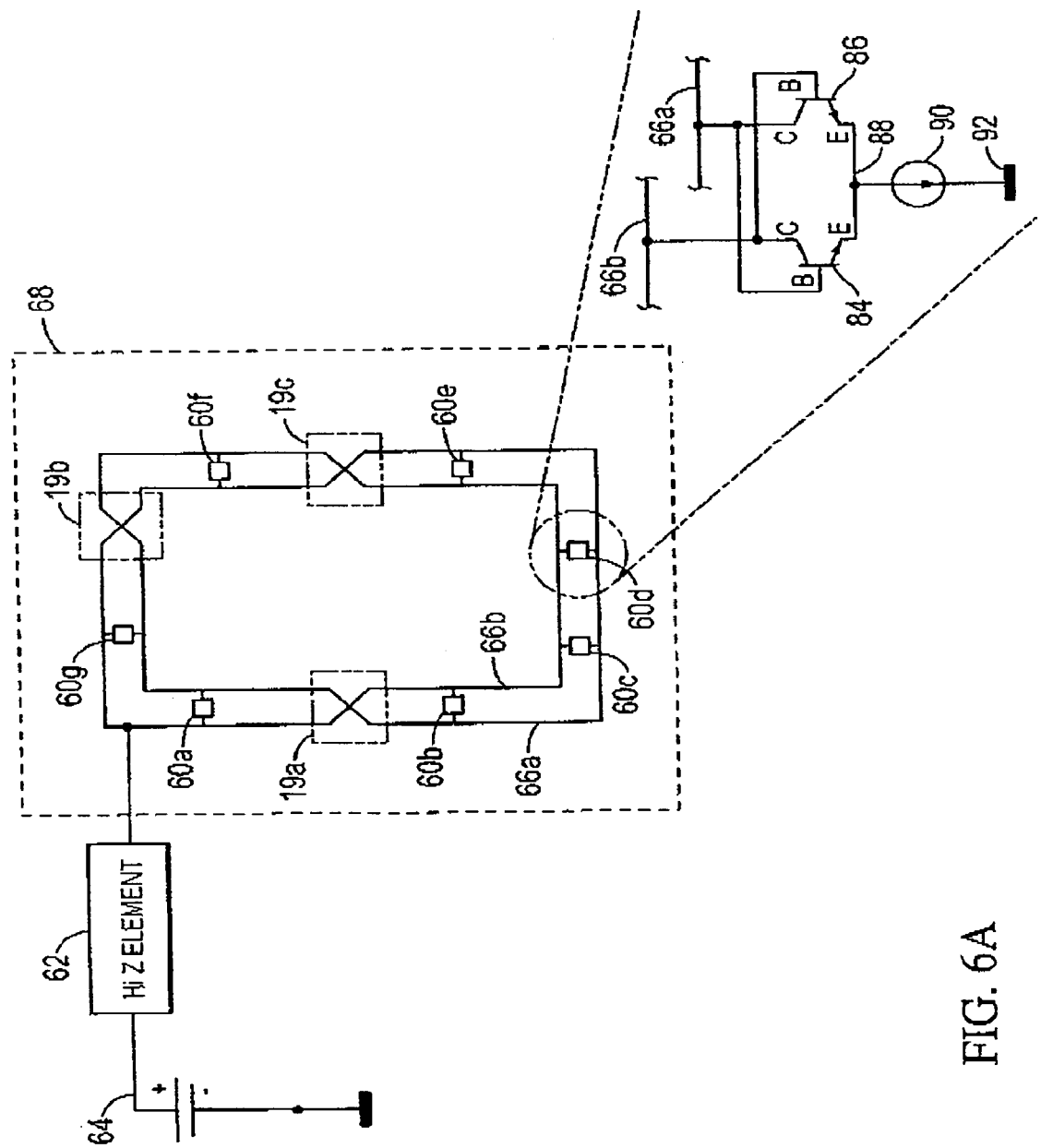
FIG. 6A shows the alternative with the current switch implemented with bipolar devices.

FIG. 6A shows the alternative with the current switches, 60a,g, for example 60d as shown, implemented with bipolar devices. The switches 60a,g each comprise a pair of 'cross-coupled' bipolar transistors 84, 86, i.e., a pair of transistors each with a base terminal connected to the collector terminal of other transistor. Each collector of the transistors is connected to one 66a,b of the pair of conductors of the oscillator. The emitters of the transistors are connected together and this common node 88 is connected to a current sink 90 whose other node is connected to a second supply voltage 92 (such as ground). The current sink 90 can be either active or passive (e.g., a resistor).

In operation, the first supply voltage 64, via the high-impedance device 62, sends current into the conductors 62a,b of the rotary oscillator 68 and absent any opposing influence tends to cause the voltage on the conductors 66a,b to slowly rise to the supply voltage 64. This occurs over a long period of time because of the high impedance element 62. As the wave travels around the loop, the wavefront (the null point of the wave) reverses the relative voltage between the conductors 66a,b. A conductor 66a or 66b that was high relative to the other conductor 66b or 66a, respectively, becomes low and visa-versa. This causes each current switch 60a-g to change state as the wavefront passes the switch. The current switches 60a-g are each configured to sink an amount of current equal to the current sink 90 from the conductor that becomes low relative to the other conductor, thereby reinforcing the action of the wavefront. Thus, prior to the arrival of the wavefront, the current switches 60a-g are statically sinking current from the conductor that has the lower voltage. After the arrival of the wavefront, the current switches now statically sink current from the opposite conductor because it has become lower due to the passage of the wavefront. This maintains the traveling of the wavefront around the loop. For a bipolar pair of transistors 84, 86, the voltage on the "high" conductor is $V_{cs}+V_{be}$ and the voltage on the "low" conductor is $V_{cs}+V_{sat}$. Therefore, the voltage difference between the two conductors 66a,b may be $V_{be}-V_{sat}$. Because the average voltage on the conductors is the supply voltage, each conductor is either $\frac{1}{2}(V_{be}-V_{sat})$ above or below the supply voltage 64.

Figure 6B:
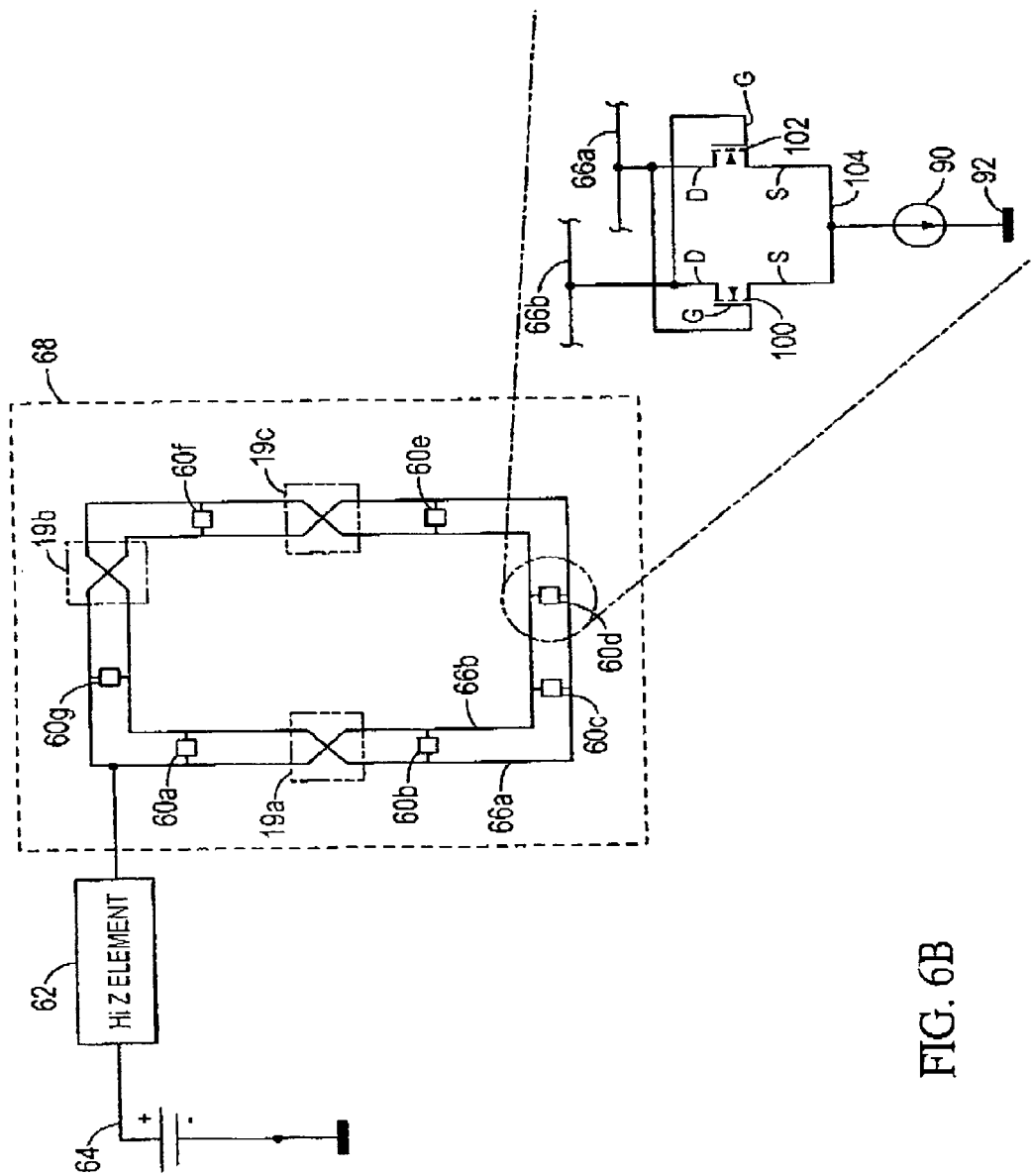
FIG. 6B shows the alternative with the current switch implemented with FET devices.

FIG. 6B shows the alternative with the current switch 60d, for example, implemented with FET devices 100, 102. A pair of NFET transistors 100, 102, each with its gate connected to the drain of the other transistor's 102, 100, respectively, is an alternative to the bipolar transistors 84, 86. In this alternative, the sources of the transistors are connected together at node 104 and to a current source 90 to the second supply voltage 92. The current source 90 can be either active or passive (e.g., a resistor).

The advantages of the use of either the bipolar transistors 84, 86 or the NFETs 100, 102 is that only n-type devices are used. These devices are inherently faster than p-type devices and thus permit a higher operating frequency of the oscillator.

Figure 2A:
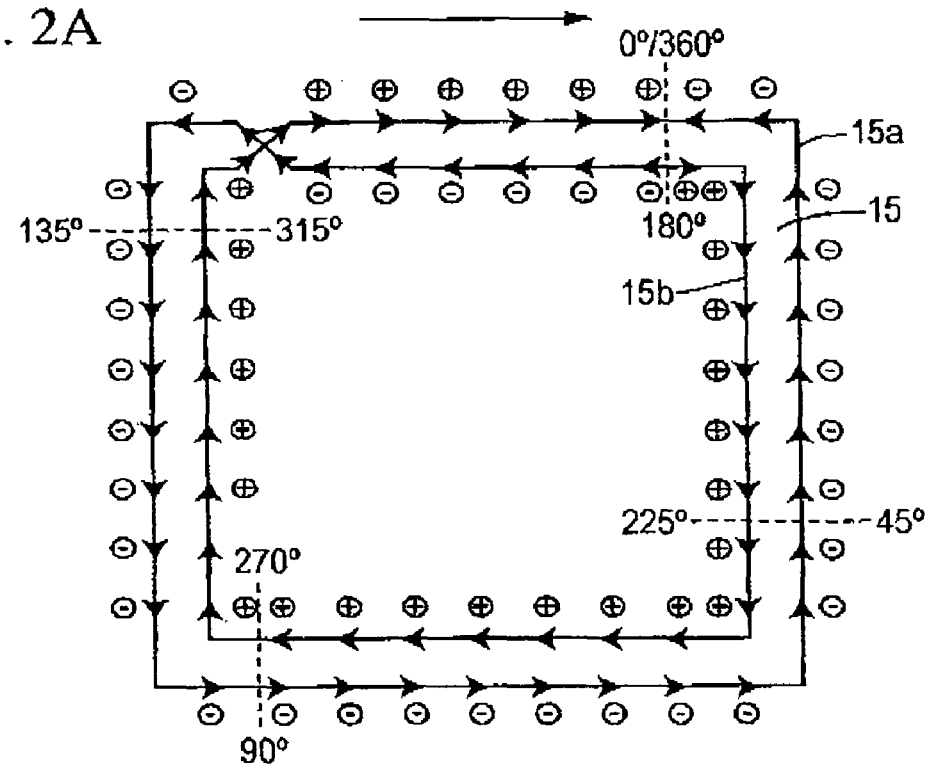
FIGS. 2A and 2B show the various phases of the rotating wave for each direction of rotation.
Figure 2B:
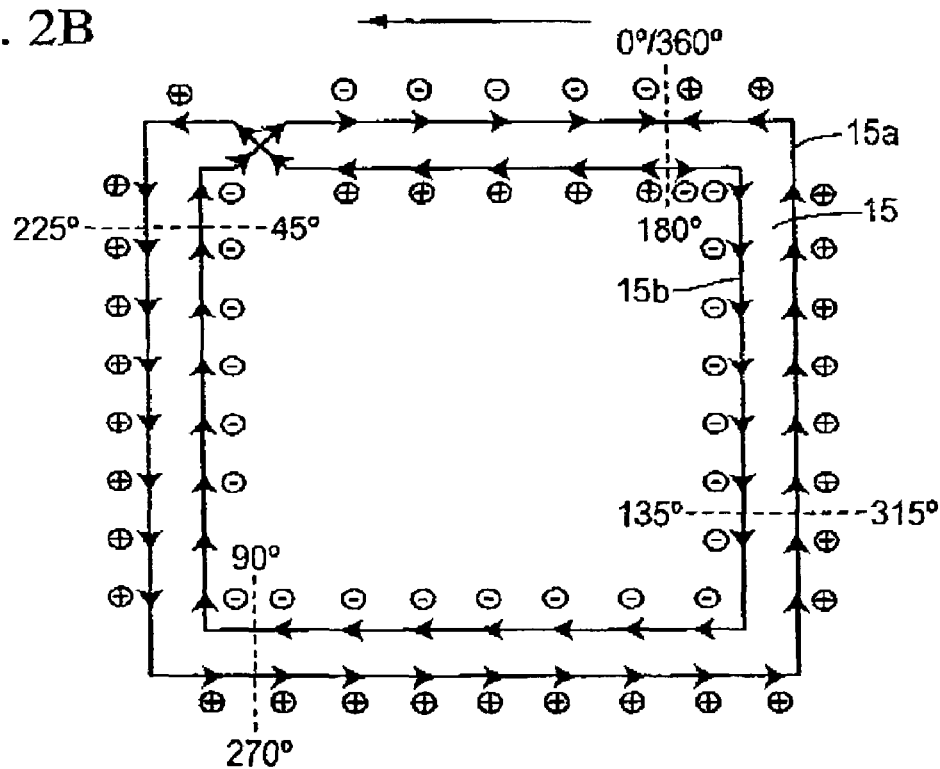
Figures 3A, 3B:
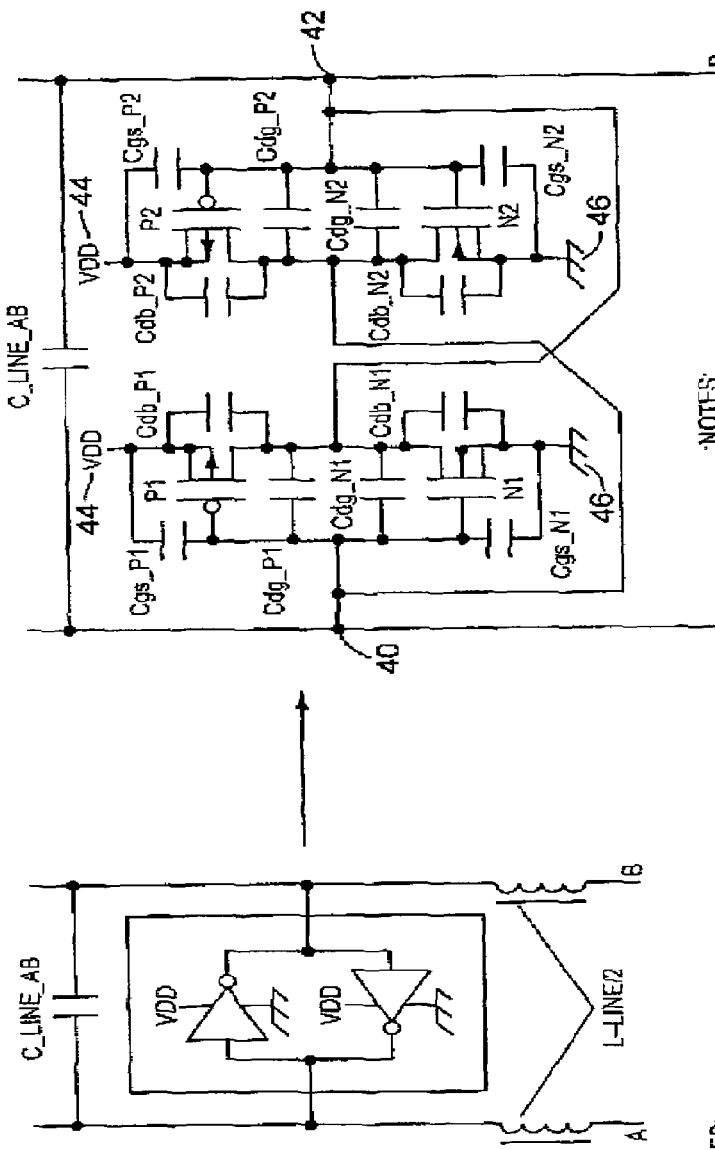
FIGS. 3A and 3B show the detail of the regeneration devices connected between the transmission line conductors of the traveling wave oscillator.
Figure 4:
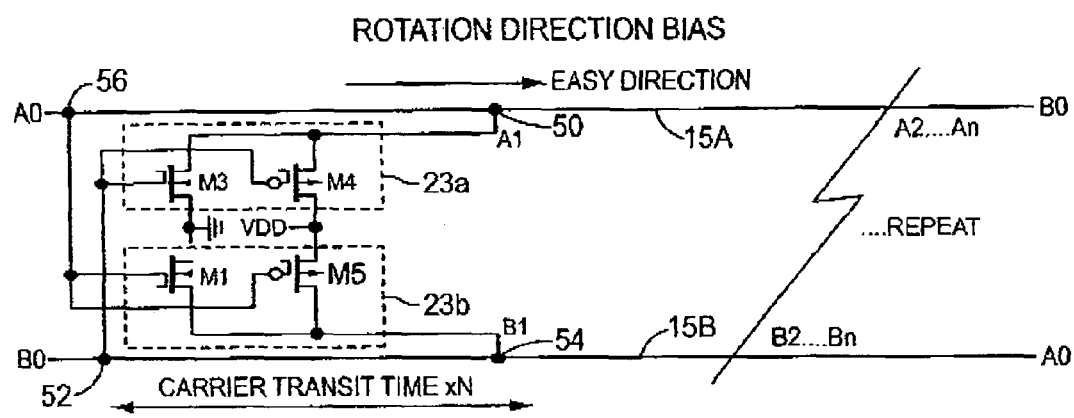
FIG. 4 shows tap and output connections to bias the rotation direction of the traveling wave.

In either case, offset connections between the base and collectors or between the gates and drains are made to bias the wave to travel in a preferred direction, as shown in FIG. 4.

Although the present invention has been described in considerable detail with reference to certain preferred versions thereof, other versions are possible. For example, other types of transistors such as p-channel FETs can be used if the highest frequency of the oscillator is not critical to the application. Therefore, the spirit and scope of the appended claims should not be limited to the description of the preferred versions contained herein.

What is claimed is:

1. An oscillator comprising:
   one or more segments, each segment being a length of two-conductor transmission line having a controlled impedance;
   an odd number of connection means for connecting the lengths of the segments together to form a closed loop of segments and connection means, wherein each connection means is energy continuous and the oscillator has a frequency determined by two transits of a wave traveling about the closed loop;

a plurality of current switches, each having a pair of nodes connected to the conductors of the segments and another node connected to a first reference voltage, and each current switch having a state and sinking current from one or the other of the conductors of the closed loop to the first reference voltage depending on the state of the switch; and at least one conductive element, connected between a conductor of one of the segments and a second reference voltage to provide a current path between the second reference voltage and the conductor of the signal path to conduct current to or from the loop, said conductive element(s) having an impedance at the frequency of the oscillator that is higher than the impedance of the transmission line;

wherein the plurality of current switches induces and maintains the traveling wave on the loop, the wave including a voltage wave with ont of two polarities, and wherein each of the connection means is operative to reverse the polarity of the voltage wave, such that any position on a segment, there is an oscillating waveform between the conductors.

2. An oscillator as recited in claim 1, wherein the impedance of the conductive element is at least twice the impedance of the transmission line.

3. An oscillator as recited in claim 1, wherein the conductive element is an inductor.

4. An oscillator as recited in claim 1, wherein the conductive element is a transmission line.

5. An oscillator as recited in claim 1, wherein each current switch includes:
   a first npn transistor having a base, collector and emitter, the collector being connected to one of the segment conductors;
   a second npn transistor having a base, collector and emitter, the collector being connected to the other one of the segment conductors and to the base of the first transistor, the base of the second transistor being connected to the collector of the first transistor, and the emitter of the second transistor being connected to the emitter of the first transistor; and
   a current source connected between the emitters of the first and second transistors and the first reference voltage to direct current from emitters to the first reference voltage.

6. An oscillator as recited in claim 1, wherein each current switch includes:
   a first NMOS transistor having a gate, source and drain, the drain being connected to one of the segment conductors;
   a second NMOS transistor having a gate, source and drain, the drain being connected to the other of the segment conductors and to the gate of the first NMOS transistor, the gate being connected to the drain of the first NMOS transistor, and the source being connected to the source of the first NMOS transistor; and
   a current source connected between the sources of the first and second transistors and the first reference voltage to direct current from the sources to the first reference voltage.

7. An oscillator as recited in claim 1, wherein the connection means is a conductor cross-over.

8. An oscillator as recited in claim 1,
   wherein the connection means is a transformer that magnetically couples pairs of segments to which it is connected;
   wherein the conductive element is connected to a first one of the segments that is on one side of the transformer; and
   further comprising a second conductive element connected to a second one of the segments that is on the other side of the transformer.

9. A method of maintaining a traveling wave on a rotary traveling wave oscillator that includes one or more segments, each segment being a length of two-conductor transmission line having a controlled impedance; and an odd number of connection means for connecting the lengths of the segments together to form a closed loop of segments and connection means, wherein each connection means is energy continuous and the oscillator has a frequency determined by two transits of a wave traveling about the closed loop, the method comprising:
   providing current to a conductor of at least one of the segments via a conductive element having an impedance at the oscillator frequency that is greater than the impedance of the closed loop; and
   removing current from the conductor of each segment that has a lower voltage relative to the other conductor as the wave travels through the segment, so as to maintain the voltage of the traveling wave.

10. A method according to claim 9, wherein the conductive element providing current is an inductor.

11. A method according to claim 9, wherein the conductive element providing current is a transmission line.

12. A method according to claim 9,
   wherein passing current is performed by providing a current path between the conductor and a first reference voltage; and
   wherein providing a current path is performed by providing a cuffent path between the conductor and a second reference voltage.

13. An oscillator as recited in claim 1, wherein each current switch includes:
   a first pnp transistor having a base, collector and emitter, the collector being connected to one of the segment conductors;
   a second pnp transistor having a base, collector and emitter, the collector being connected to the other one of the segment conductors and to the base of the first transistor, the base of the second transistor being connected to the collector of the first transistor, and the emitter of the second transistor being connected to the emitter of the first transistor; and
   a current source connected between the emitters of the first and second transistors and the first reference voltage to direct current from emitters to the first reference voltage.

14. An oscillator as recited in claim 1, wherein each current switch includes:
   a first PMOS transistor having a gate, source and drain, the drain being connected to one of the segment conductors;
   a second PMOS transistor having a gate, source and drain, the drain being connected to the other of the segment conductors and to the gate of the first PMOS transistor, the gate being connected to the drain of the first PMOS transistor, and the source being connected to the source of the first PMOS transistor; and
   a current source connected between the sources of the first and second transistors and the first reference voltage to direct current from the sources to the first reference voltage.

* * * * *